(12) United States Patent
Wirth

(10) Patent No.: US 6,649,939 B1
(45) Date of Patent: Nov. 18, 2003

(54) LIGHT-EMITTING DIODE WITH A STRUCTURED SURFACE

(75) Inventor: Ralph Wirth, Regensburg (DE)

(73) Assignee: Osram Opto Semiconductors GmbH & Co. OHG, Regensburg (DE)

( * ) Notice: Subject to any disclaimer, the term of this patent is extended or adjusted under 35 U.S.C. 154(b) by 0 days.

(21) Appl. No.: 10/070,584

(22) PCT Filed: Sep. 4, 2000

(86) PCT No.: PCT/DE00/03027

§ 371 (c)(1),
(2), (4) Date: Jun. 25, 2002

(87) PCT Pub. No.: WO01/18883

PCT Pub. Date: Mar. 15, 2001

(30) Foreign Application Priority Data

Sep. 10, 1999 (DE) ........................ 199 43 406

(51) Int. Cl.⁷ ........................ H01L 33/00; H01L 23/48
(52) U.S. Cl. ........................ 257/95; 257/91; 257/98; 257/99; 257/744; 257/745; 362/296; 362/341
(58) Field of Search ........................ 257/95, 98, 91, 257/99, 744, 745; 362/296, 341, 327, 346, 347, 348, 349, 350, 800

(56) References Cited

U.S. PATENT DOCUMENTS

| 4,864,370 A | * | 9/1989 | Gaw et al. ........................ 257/94 |
| 5,008,718 A | | 4/1991 | Fletcher et al. |
| 5,233,204 A | | 8/1993 | Fletcher et al. |
| 5,779,924 A | * | 7/1998 | Krames et al. ........................ 216/24 |
| 6,091,085 A | | 7/2000 | Lester |

FOREIGN PATENT DOCUMENTS

| DE | 42 18 806 | 12/1993 |
| DE | 195 37 544 | 4/1997 |
| DE | 197 09 228 | 9/1997 |
| EP | 0 405 757 | 1/1991 |
| EP | 0 544 512 | 6/1993 |
| EP | 0 732 740 | 9/1996 |

OTHER PUBLICATIONS

Schnitzer et al, "30% external quantum efficiency from surface textured, thin–film light–emitting diodes", *Applied Physics Letters.*, vol. 63, No. 16, Oct. 18, 1993, pp. 2174–2176.

Windisch et al, "Light–emitting diodes with 31% external quantum efficiency by outcoupling of lateral waveguide modes", *Applied Physics Letters*, vol. 74, No. 16, Apr. 19, 1999, pp. 2256–2258.

* cited by examiner

*Primary Examiner*—Minh Loan Tran
*Assistant Examiner*—Tan Tran
(74) *Attorney, Agent, or Firm*—Schiff Hardin & Waite

(57) ABSTRACT

For improving the light output, a light-emitting diode has at least one section of a light exit-side surface covered with a plurality of truncated pyramids. Light radiations, which are emitted by a light-generating layer, enter into the truncated pyramids through a base area and are efficiently coupled out of the sidewalls of the pyramids.

20 Claims, 3 Drawing Sheets

LIGHT-EMITTING DIODE WITH A STRUCTURED SURFACE

BACKGROUND OF THE INVENTION

The invention is directed to a light-emitting diode comprising a semiconductor layer structure containing a substrate and at least one light-generating layer formed on the substrate, a first electrical contact layer on the substrate and a second electrical contact layer on at least a section of a surface of the semiconductor structure lying opposite the substrate. In particular, the invention is directed to a light-emitting diode wherein the surface lying opposite the substrate comprises a plurality of truncated pyramids on at least one section for improving the light outfeed.

Light-emitting diodes such as semiconductor light-emitting diodes (LED) are particularly distinguished in that the internal conversion efficiency of supplied electrical energy into radiant energy can be very high, definitely greater then 80%, dependent on the material system. The effective light output from the semiconductor crystal, however, is made more difficult by the high discontinuity in the refractive index between the semiconductor material (typically n=3.5) and the surrounding resin casting material (typically n=1.5). The small total reflection angle, which occurs because of the discontinuity at the boundary surface between semiconductor and resin casting material, is approximately 26° and leads to the fact that only a fraction of the generated light can be coupled out. A radiation beam that is not emitted in the approximately 26° wide output cone remains trapped in the semiconductor crystal in the simple cuboid shape of the LED typically employed in manufacture since its angle relative to the surface normal is also not changed by multiple reflection. The radiation beam, consequently, is lost earlier or later due to absorption, particularly in the region of the contact, the active zone or in the substrate. Particularly given InGaAlP LEDs, the absorbent GaAs substrate represents a particular problem. In conventional LEDs of this species, the rays emitted from the active zone in the direction toward the surface of the LED that lie outside the output cone are lost by absorption in the substrate with high probability.

The approach employed most often in practice to alleviate this problem is to apply a thick semiconductor layer at the upper side of the LED. This enables the partial utilization of the lateral output cone of the emitted light radiation.

U.S. Pat. No. 5,008,718 has disclosed that an electrically conductive GaP layer that is transparent for the emitted light radiation is applied onto the active, light-emitting layers in an AlGaInP LED, mainly for reasons of the lateral spread of the current injected by an electrical contact. The advantageous side-effect of reducing the internal total reflection and enabling the lateral output of the light radiation due to the action of the thick GaP layer is pointed out elsewhere. It is additionally proposed that the GaAs substrate that is opaque for the emitted light radiation be removed by etching and be replaced by at least one transparent substrate layer of a suitable material such as GaP.

U.S. Pat. No. 5,233,204 also proposes the employment of one or more thick and transparent layers in a light-emitting diode. Various configurations are disclosed for the arrangement and plurality of these transparent layers. Among other things, a layer that is arranged under the active, light-generating layer and tapers in the direction toward the substrate and is fashioned funnel-shaped is disclosed in FIG. 10 of this reference.

The solutions that have been hitherto disclosed, however, are either relatively technologically involved or do not produce the desired enhancement of the light output from the light-emitting diode. In particular, the growth of a relatively thick, transparent semiconductor layer is a comparatively time-consuming procedure in the manufacture, since either the metallo-organic vapor phase epitaxy (MOCVD) or the molecular beam epitaxy (MBE) are utilized given these growth methods. The production of a 10–20 µm-thick transparent semiconductor layer is a time-consuming process that lengthens the overall duration of the manufacture of the light-emitting diode in an unacceptable way.

SUMMARY OF THE INVENTION

It is thus an object of the present invention to specify a light-emitting diode having a highly effective light output that can be manufactured without additional, complicated or time-consuming manufacturing steps.

This object is achieved by an improvement in a light-emitting diode having a semiconductor layer structure containing a substrate and at least one light-generating layer formed on the substrate, a first electrical contact layer on the substrate and a second electrical contact layer on at least one section of that surface of the semiconductor structure lying opposite the substrate. The improvement is that the surface lying opposite the substrate is structured over at least one section so that it comprises either a plurality of truncated pyramids or a plurality of truncated cones.

In one embodiment of the present invention, the truncated pyramids are implemented three-sided.

In the inventive truncated pyramids, a light beam is diverted into an output cone as a result of multiple reflections. Only beams that proceed steeply toward the upper side of the LED are employed for the output. As a result thereof, long paths in the light-generating layer are avoided. The oblique sidewalls of the truncated pyramids assure that the initially steeply upwardly proceeding rays proceed more flatly with each one of the reflections, so that they are ultimately laterally coupled out from the sidewalls of the truncated pyramids.

Preferably, that section of the light exit-side surface covered with the second electrical contact layer is unstructured. In an exemplary embodiment, the second electrical contact layer given a quadratic or rectangular LED is applied in the form of a cross-structure on the light exit-side surface. This cross-structure is composed of essentially circular connecting pad in the center of the rectangular light exit-side surface and of finger-like terminal surfaces proceeding from the circular circumference in the direction toward the four comers of the chip. The sections lying between these four finger-shaped terminal surfaces are respectively occupied with a plurality of truncated pyramids, these being arranged so that an optimally great plurality thereof can be applied.

There are a number of parameters with respect to the shape of the truncated pyramids that lead to an optimization of the output, as has been investigated in detail given what is referred to as ray-tracing simulations. Optimized parameter ranges for three-sided truncated pyramids are recited below. When the truncated pyramid comprises a base area A and a height h, then V describes the ratio of the root of the base area to the height of the truncated pyramid:

$$V = A^{1/2}/h$$

Further, the angles of incidence of the three sidewalls of the truncated pyramid $\phi$ and the angles $\alpha$, $\beta$ and $\gamma$ of the triangular base area are of significance.

The best results are achieved with the following parameter ranges according to the ray-tracing simulations:

$0.1 \leq V \leq 10$ $45° \leq \phi \leq 88°$ $\alpha, \beta, \gamma > 10°$

Especially good values for the light output derived given $V=1$, $\phi=75°$ and an isosceles triangle as the base area having a principal angle $\theta=70°$.

The present invention also comprises the advantage that it is based on a non-local output principle, so that processes for current constriction that are difficult to govern are eliminated. Further, only the upper window need be structured, whereas the active zone is not etched through and is definitely not damaged. The structure is comparatively simple to realize with only one additional lithography process step and subsequent dry etching.

Moreover, truncated pyramids, which have four or more then four sides can also be utilized in the present invention.

Exemplary embodiments of the present invention are explained in greater detail below with reference to the drawings.

DESCRIPTION OF THE PREFERRED EMBODIMENTS

Figure 1:
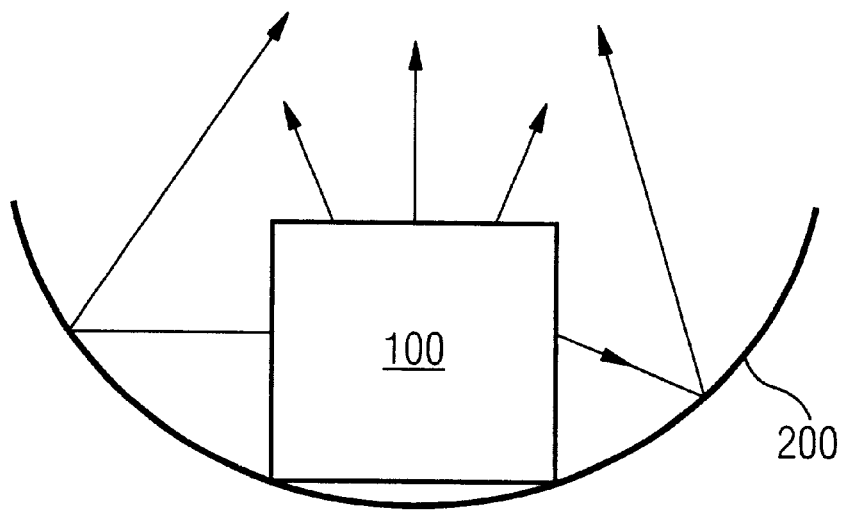
FIG. 1 is a schematic, simplified cross-sectional view of the standard arrangement of a LED in a reflector.

FIG. 1 shows a LED chip 100 as arranged in a reflector 200 having a circular or parabolic cross-section, so that the light rays emitted by it are both emitted in a direct way as well as collected by the reflector 200 and emitted essentially in the same direction. In general, the LED chip 100 is embedded in a resin casting material, so that a boundary surface between semiconductor material and resin casting material is present, particularly at the surface at its light exit side. A relatively great discontinuity in refractive index exists at this boundary surface, so that a total reflection already occurs given relatively slight angles of incidence relative to the normal. These totally reflected rays should be coupled out through the sidewalls of the LED chip 100 insofar as possible and should be capable of being collected by the reflector 200 instead of being absorbed in the substrate of the LED chip 100.

An inventive light-emitting diode comprises a semiconductor layer structure having a light-absorbent substrate and at least one light-generating layer formed on the substrate. The light-generating layer is formed by a pn-junction. If desired, a single or multiple quantum well structure can be provided as the light-generating layer. The light-generating layer is located relatively close to the light exit-side surface of the semiconductor layer structure lying opposite the substrate. A first electrical contact layer is applied surface-wide on the substrate, whereas a second electrical contact layer is applied onto at least one section of that surface of the light-generating layer lying opposite the substrate. Preferably, this surface is structured in those sections not occupied by the second electrical contact layer so that it has a plurality of three-sided truncated pyramids.

Figure 2:
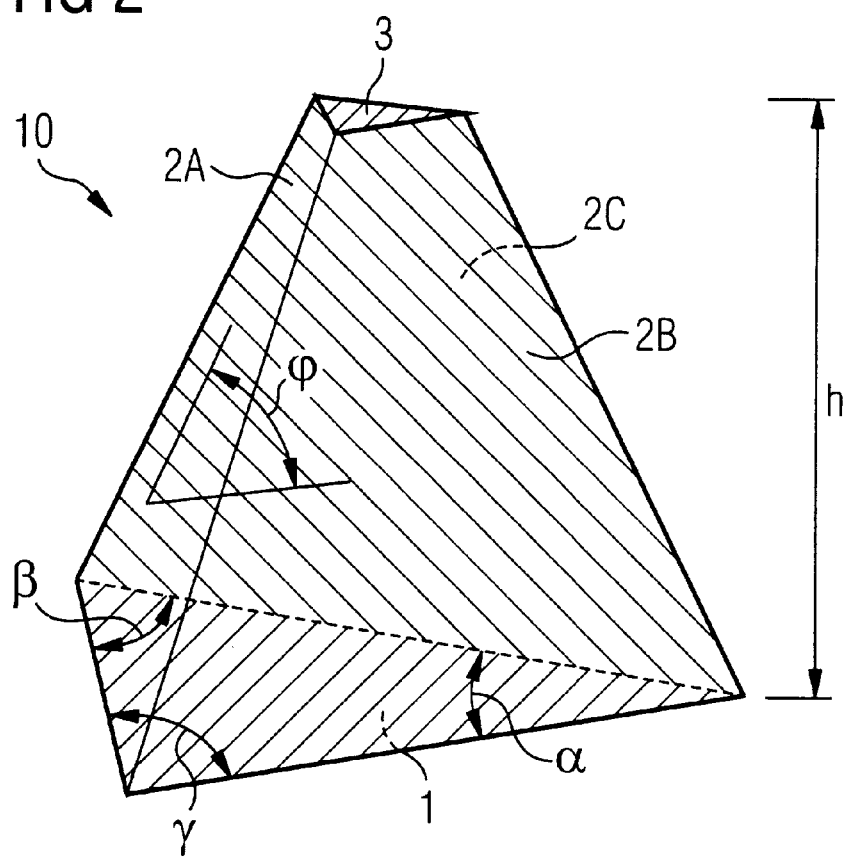
FIG. 2 is an exemplary form of an inventive, three-sided truncated pyramid.

Such a truncated pyramid 10 is shown in perspective in FIG. 2 by way of example. It comprises a base area 1 whose area content amounts to A and whose angles are referenced $\alpha$, $\beta$, and $\gamma$. In terms of amount, these angles are preferably respectively greater than 10°. For example, an isosceles triangle can be utilized, whereby a principal angle $\theta$ comprises an angular dimension of 70°. The sidewalls 2A, 2B and 2C of the truncated pyramid 10 comprise incident angles $\phi$ that preferably lie in a range between 45° and 85°. The truncated pyramid 10 thus tapers to an area 3 that lies opposite the base area 1, whereby the planes of the base area 1 and the area 3 lie parallel to one another.

In the LED chip, the surface lying opposite the substrate is covered with truncated pyramids 10 of the illustrated type over at least one section. As standard, the LED chip can be cast out with an epoxy resin material, so that a discontinuity in refractive index to the surrounding resin material occurs at the sidewalls 2A, 2B and 2C of the truncated pyramids 10. Light rays that enter into the truncated pyramid 10 through the base surface 1 from a pn-junction under the truncated pyramid 10 are either totally reflected at the sidewalls 2A, 2B and 2 or are coupled out of the LED chip. Light rays that pass through the base area 1 at an oblique angle are incident relatively perpendicularly onto the sidewalls 2A, 2B and 2C and thereby emerge directly through these sidewalls. Other light rays that pass perpendicularly through the base area 1 are in turn incident onto the sidewalls 2A, 2B and 2C at a relatively flat angle and are therefore totally reflected by these sidewalls. After a reflection, however, the light ray encounters the sidewall lying opposite. As a consequence of the oblique position of the sidewalls, the incident angle of the light ray onto the respective sidewall becomes smaller with every reflection, so that a lateral output of the light ray from the truncated pyramid 10 occurs after a specific plurality of reflections. The implementation of what are referred to as ray-tracing simulations has shown that an optimized configuration of the parameters of the truncated pyramid is established by an isosceles triangle as the base area 1 having a principal angle $\theta=70°$, the incident angles $\phi=75°$ and the height h of the truncated pyramid 10 corresponding to the root of the area dimensioned A of the base area 1.

Figure 3:
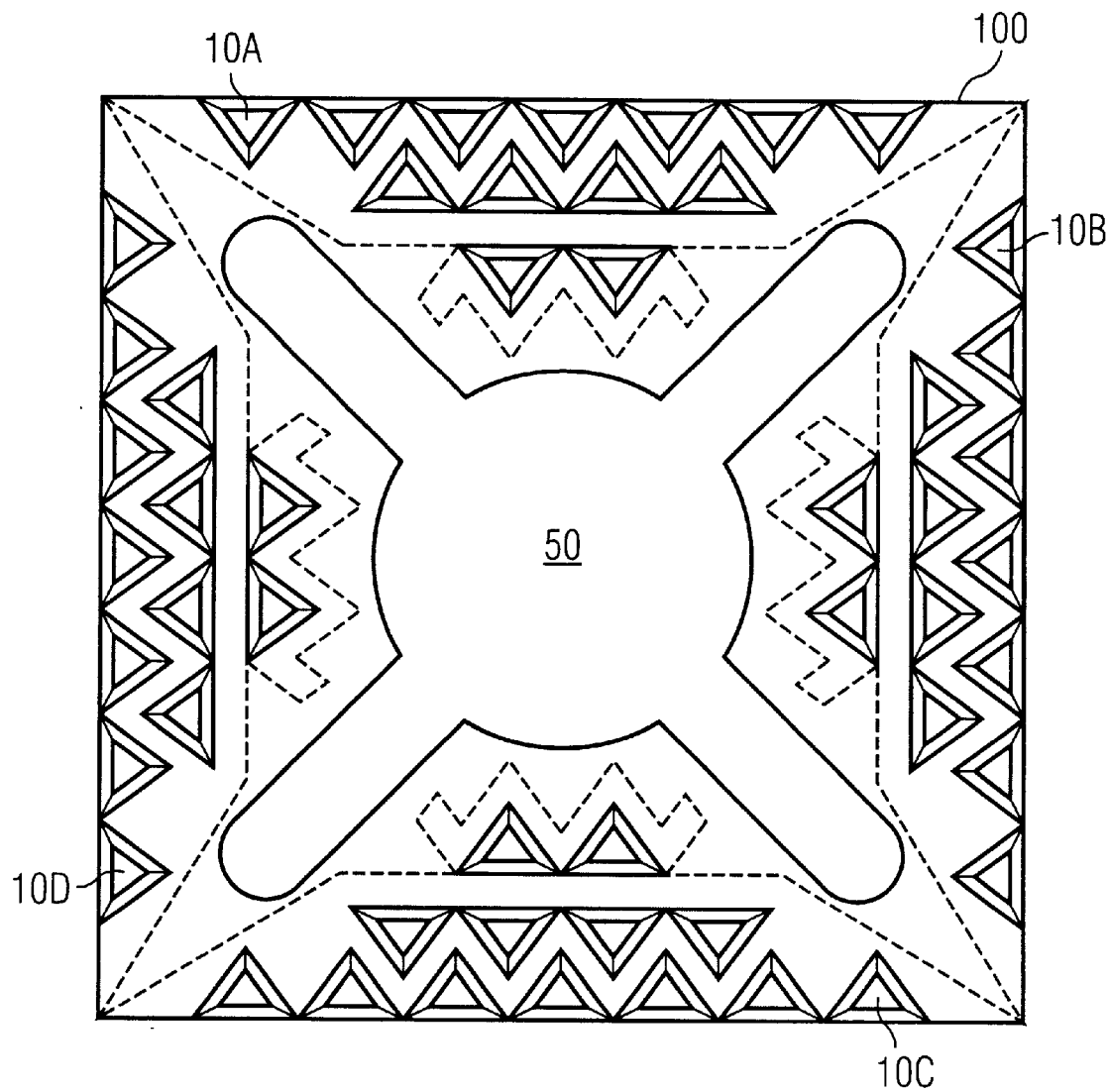
FIG. 3 a plan view onto a rectangular surface of a LED that is occupied in sections with the inventive truncated pyramids and FIG. 4 is a cross-sectional view of a light-emitting diode of the present invention.

FIG. 3 shows a plan view of that surface of a LED chip 100, which surface is opposite the substrate. A first electrical contact layer (not shown) is applied on the substrate, whereas the surface shown in FIG. 3 is provided with a second electrical contact layer 50. This second electrical contact layer 50 comprises a cross-structure having a central, circular contact area and finger-like contact surfaces proceeding from the central circular contact area in the direction toward the corners of the rectangular surface. The second electrical contact layer 50 can be formed by an opaque metal layer or by a thin, transparent layer such as an ITO (indiumtinoxide) layer. At any rate, transparent window regions with respective truncated pyramids 10A, 10B, 10C and 10D formed between the finger-like contact surfaces of the second electrical contact layer 50. The upper, smaller area and the lower base area for each of the truncated pyramids can be seen in the plan view. The truncated pyramids are arranged so that an optimally great plurality can be arranged in each of the window-like regions.

When a transparent contact layer 50 is provided, then an occupation with truncated pyramids 10 can also be undertaken in the region of the contact layer 50.

Truncated pyramids having four or more then four sides can also be employed. The limit case of a truncated cone that comprises a circular cross-sectional area can also be employed by the present invention.

Figure 4:
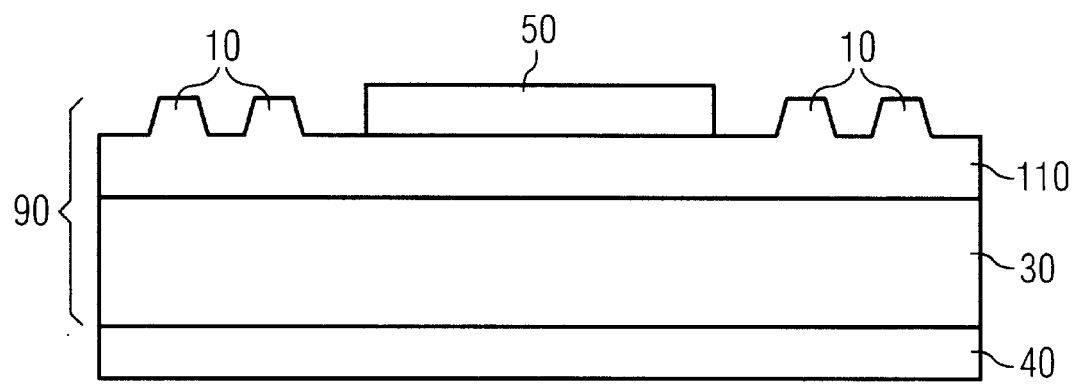

FIG. 4 shows a light-emitting diode which has a semiconductor layer structure 90 which has a substrate 30 and a light-generating layer 110 with truncated pyramids 10. A first electrical contact layer 40 is on the substrate 30 and a second electrical contact layer 50 is on the light-generating layer 110.

I claim:

1. A light-emitting diode comprising:
   a semiconductor layer structure containing a substrate and at least one light-generating layer formed on the substrate,
   a first electrical contact layer on the substrate and
   a second electrical contact layer on at least one section of a surface of the semiconductor structure lying opposite the substrate,
   the surface of the semiconductor structure lying opposite the substrate being structured over at least one section to have a plurality of truncated elements selected from truncated pyramids and truncated cones outside a region of the second electrical contact layer.

2. The light-emitting diode according to claim 1, wherein the truncated elements are three-sided truncated pyramids.

3. The light-emitting diode according to claim 1, wherein the truncated elements are truncated pyramids having at least four sides.

4. The light-emitting diode according to claim 1, wherein the section of the surface lying opposite the substrate that is covered with the second electrical contact layer is unstructured.

5. The light-emitting diode according to claim 1, wherein the substrate is formed of GaAs and the light-generating layer is formed of InGaAlP.

6. The light-emitting diode according to claim 1, wherein the truncated elements are generated by an additional lithographic process step and subsequent dry etching.

7. The light-emitting diode according to claim 1, wherein
   the surface of the semiconductor structure lying opposite the substrate is a rectangular surface with four corners;
   the second electrical contact layer is formed by a cross structure with a central terminal surface and finger-shaped terminal surfaces proceeding therefrom in the direction toward the four corners of the rectangular surface;
   regions of the rectangular surface between the finger-shaped terminal surfaces are covered with truncated elements.

8. The light-emitting diode according to claim 7, wherein the second electrical contact layer is opaque for the emitted light radiation.

9. The light-emitting diode according to claim 7, wherein the second electrical contact layer is formed by a transparent, thin, electrically conductive layer.

10. The light-emitting diode according to claim 9, wherein the electrically conductive layer is an indium tin oxide layer.

11. The light-emitting diode according to claim 1, wherein the second electrical contact layer is opaque for the emitted light radiation.

12. The light-emitting diode according to claim 1, wherein the second electrical layer is formed by a transparent electrically-conductive layer.

13. The light-emitting diode according to claim 12, wherein the electrically-conductive layer is an indium tin oxide layer.

14. A light-emitting diode comprising:
   a semiconductor layer structure containing a substrate and at least one light-generating layer formed on the substrate,
   a first electrical contact layer on the substrate and
   a second electrical contact layer on at least one section of a surface of the semiconductor structure lying opposite the substrate,
   the surface of the semiconductor structure lying opposite the substrate being structured over at least one section to have a plurality of three-sided truncated pyramids that are defined by the following parameter ranges:

$0.1 \leq V \leq 10$,
   $45° \leq \phi \leq 88°$,
   $\alpha, \beta, \gamma > 10°$, whereby $V = A^{1/2}/h$ applies and A is an area dimension of a triangular base area of each truncated pyramid and h is the height of the truncated pyramid, $\phi$ is the angle of incidence of each sidewall of the truncated pyramids and $\alpha, \beta, \gamma$ are the angles of the triangular base area.

15. The light-emitting diode according to claim 14, wherein $V=1$, $\phi=75°$ apply for all sidewalls, and the base area is an isosceles triangle with the principal angle $\theta=70°$.

16. The light-emitting diode according to claim 14, wherein the surface of the semiconductor structure lying opposite the substrate is a rectangular surface with four corners, the second electrical contact layer is formed by a cross structure with a central terminal surface and finger-shaped terminal surfaces proceeding therefrom and in the direction toward the four corners, and the regions of the rectangular surface between the finger-shaped terminal surfaces are covered with truncated pyramids.

17. The light-emitting diode according to claim 16, wherein the second electrical contact layer is opaque for the emitted light radiation.

18. The light-emitting diode according to claim 16, wherein the second electrical contact layer is formed by a transparent, thin, electrically conductive layer of indium tin oxide.

19. The light-emitting diode according to claim 14, wherein the section of the surface lying opposite the substrate that is covered with the second electrical contact layer is unstructured.

20. The light emitting diode according to claim 14, wherein the truncated elements are generated by an additional lithographic process step and subsequent dry etching.

* * * * *